United States Patent [19]
Contolatis et al.

[11] Patent Number: 5,545,924
[45] Date of Patent: Aug. 13, 1996

[54] THREE DIMENSIONAL PACKAGE FOR MONOLITHIC MICROWAVE/MILLIMETERWAVE INTEGRATED CIRCUITS

[75] Inventors: Athanase Contolatis, Bloomington; Vladimir Sokolov, Shakopee, both of Minn.

[73] Assignee: Honeywell Inc., Minneapolis, Minn.

[21] Appl. No.: 102,685

[22] Filed: Aug. 5, 1993

[51] Int. Cl.⁶ ........................ H01L 23/16; H01L 23/02; H01L 23/12
[52] U.S. Cl. .................... 257/724; 257/728; 333/246; 333/247
[58] Field of Search .................. 333/246, 247; 257/728, 723, 724

[56] References Cited

U.S. PATENT DOCUMENTS

| | | | |
|---|---|---|---|
| 4,770,640 | 9/1988 | Walter | 439/69 |
| 4,893,174 | 1/1990 | Yamada et al. | 357/82 |
| 5,006,925 | 4/1991 | Bregman et al. | 357/82 |
| 5,031,072 | 7/1991 | Malhi et al. | 257/723 |

FOREIGN PATENT DOCUMENTS

| | | | |
|---|---|---|---|
| 0461458 | 12/1991 | European Pat. Off. | 257/724 |
| 0575806 | 12/1993 | European Pat. Off. | 257/724 |
| 58-53847 | 3/1983 | Japan | 257/728 |
| 1-143230 | 6/1989 | Japan | 257/728 |
| 3-266501 | 11/1991 | Japan | 333/246 |
| 4-38855 | 2/1992 | Japan | 257/728 |

OTHER PUBLICATIONS

Abstract–JP patent 61 088 547 A (Fujitsu Ltd.), *Patent Abstracts of Japan*, vol. 10, No. 263 (E–435)(2319), Sep. 9, 1986.
Abstract–JP patent 03 064 218 A (Mitsubishi Electric), *Patent Abstracts of Japan*, vol. 15, No. 223(E–1075), Jun. 7, 1991.
Abstract–JP patent 63 194 350 A (Fujitsu Ltd.), *Patent Abstracts of Japan*, vol. 12, No. 474 (E–692), Dec. 12, 1988.

*Primary Examiner*—Jerome Jackson
*Assistant Examiner*—Donald L. Monin, Jr.
*Attorney, Agent, or Firm*—John G. Shudy, Jr.; Kenneth J. Johnson

[57] ABSTRACT

A three-dimensional interconnect package is provided for monolithic microwave/millimeterwave integrated circuits. A mating substrate for receiving an MMIC has transmission lines disposed over its surfaces. The mating substrate mounted substantially vertical in a base substrate which also has transmission lines for carrying microwave/millimeterwave signals. The transmission lines on both substrates are put in electrical contact and microwave/millimeterwave signals are transmitted between the substrates with a minimum of signal loss or reflection.

17 Claims, 8 Drawing Sheets

THREE DIMENSIONAL PACKAGE FOR MONOLITHIC MICROWAVE/MILLIMETERWAVE INTEGRATED CIRCUITS

FIELD OF THE INVENTION

The present invention relates to MMIC chips and more specifically to the packaging and interconnection of the MMIC chips.

BACKGROUND OF THE INVENTION

Monolithic microwave integrated circuits (MMIC) have well known uses in electrical circuitry operating in the microwave/millimeter-wave range. These electronic components are used in communication and navigation systems, tactical and strategic sensors, and electronic warfare. A preferred material in making the MMIC chips is gallium arsenide (GaAs). Because complex GaAs chips may have certain fabrication and operation problems, it is usually more convenient to make high level circuits or "modules" from a plurality of MMIC chips thus creating an integrated circuit assembly. A common module is a microwave/millimeter-wave transmit/receive module for use in phased array systems employed in satellite communications and radar systems.

Each MMIC chip may contain several microwave or millimeterwave circuits such as amplifier, mixer, or oscillator circuits depending on the function and level of integration. For interfacing with both DC and RF signals and currents, a MMIC typically has contact pads around the perimeter of its top surface. MMIC chips may be mounted in recesses or gaps in a carrier surface such as a substrate, and interconnections between contact pads on the chip surface and interconnect metallizations on the chip carrier are made of bonding wires or ribbon. In the case of RF connections, either microstrip or coplanar waveguides are used for waveguide transmission over the carrier. Carriers which use microstrip lines typically have a conducting ground plane on the bottom surface of the carrier in opposing relation to the top conductor lines. Impedance of the strip line is primarily controlled by line geometry, such as width and thickness, or proximity to a ground plane.

Advanced phased array applications generally dictate a very large number of antenna elements in the array to support high gain or large directivity requirements. In a typical application for extremely high frequency (EHF) 30–300 GHz antennas, a given array consists of 3000–5000 elements interspersed in a rectangular array. In an active aperture, array elements are associated with each of the antenna elements. Because of the large number of antenna elements required, some sort of high density interconnection of the MMIC chips is required.

Efficient and low cost interconnection of such MMIC chips becomes a major challenge for successful module performance, especially in high frequency, large array applications. Within the modules, which tend to become quite small at higher frequencies, the individual chips should be interconnected by connections which preserve transmission line quality (i.e., maintain transmission line impedances and avoid discontinuities causing reflections) and which are short to minimize unnecessary time delays in processing the signals.

Existing modules attempt to offer economical interconnection methods between MMIC's in the module while providing a production oriented design. One such module uses a grid array resembling a waffle. This package contains a series of dielectric coated wires running between recessed receiving locations or unpackaged chips. Layers of metal foil between wires minimize cross coupling. This system also requires manufacturing intensive wire routing to the appropriate devices. However, coupling to a waveguide must be done through an additional transition piece (probe pins). Although the subsystems may provide acceptable interconnection between multiple MMIC's, they require the employment of a separate waveguide coupler and are relatively high in cost due partially to their fabrication complexity.

Two other types of modules either employ a coplanar method or a coaxial feedthrough. In the coplanar method, a large substrate has multiple recesses formed into its surface which are each sized to receive a MMIC chip. Conductive striplines are patterned over the top surface of the substrate to provide interconnection between the MMIC chips. The drawback of this type of module, is that each of the MMIC chips must be properly spaced so as not to interfere with the operation of another chip. Positioning all the MMIC chips in one plane takes up a significant amount of area which goes against some of the high density requirements of the phased array antenna.

In a coaxial module, the MMIC's are positioned in substrate chip carriers. The chip carriers are then stacked one on top of the other. A feedthrough is then created through each of the chip carriers to provide interconnection between each of the MMIC's at the different levels. The size of the feedthrough with respect to the required impedance can be large, the fabrication process is difficult, and the interfacing of the circuits on different levels creates an additional packaging problem.

Therefore, what is needed is a MMIC module which does not take up a great amount of area and is easy to manufacture. It is important that a large number of MMIC's are located in a small area without the problems of interference and poor electrical interconnection between the integrated circuits.

SUMMARY OF THE INVENTION

Disclosed herein is a three-dimensional package for monolithic/millimeter integrated circuits. Included in the package is a base substrate having opposing sides and at least one slot which passes through the thickness of the substrate. If there is more than one slot, multiple slots are arranged in a parallel fashion. Disposed on one side of the base substrate are transmission lines for carrying microwave or millimeter-wave signals as well as a ground plane.

Also included in the package is at least one mating substrate which has opposite sides and a lower edge sized to be held in one of the slots through the base substrate. A ground plane and transmission lines are disposed over the mating substrates. While the mating substrate is inserted in the base substrate the transmission lines of both lines come into electrical contact to provide a signal path of constant impedance. This connection allows high quality communication between electronic devices disposed on the MMIC chips in the same module as well as electrical communication outside the module.

DESCRIPTION OF THE PREFERRED EMBODIMENT

The present invention provides a package of multiple microwave integrated circuits (MMIC's) mounted in a vertical configuration. Multiple MMIC's are mounted adjacent to substrates and electrically connected to transmission lines which are disposed over the surface of the substrate. The substrate is inserted in a slot in a base substrate and the transmission lines on the MMIC substrate contact transmission lines disposed on the base substrate. The transmission lines are comprised of a combination of microstrip conductors and a ground plane disposed on the substrate. When the transmission lines are aligned properly, RF signals are carried to and from the MMIC's without a significant amount of signal loss due to changes in impedance of the transmission lines. The arrangement allows MMIC's to be packaged in a small area without taking up a lot of space.

Figure 1:
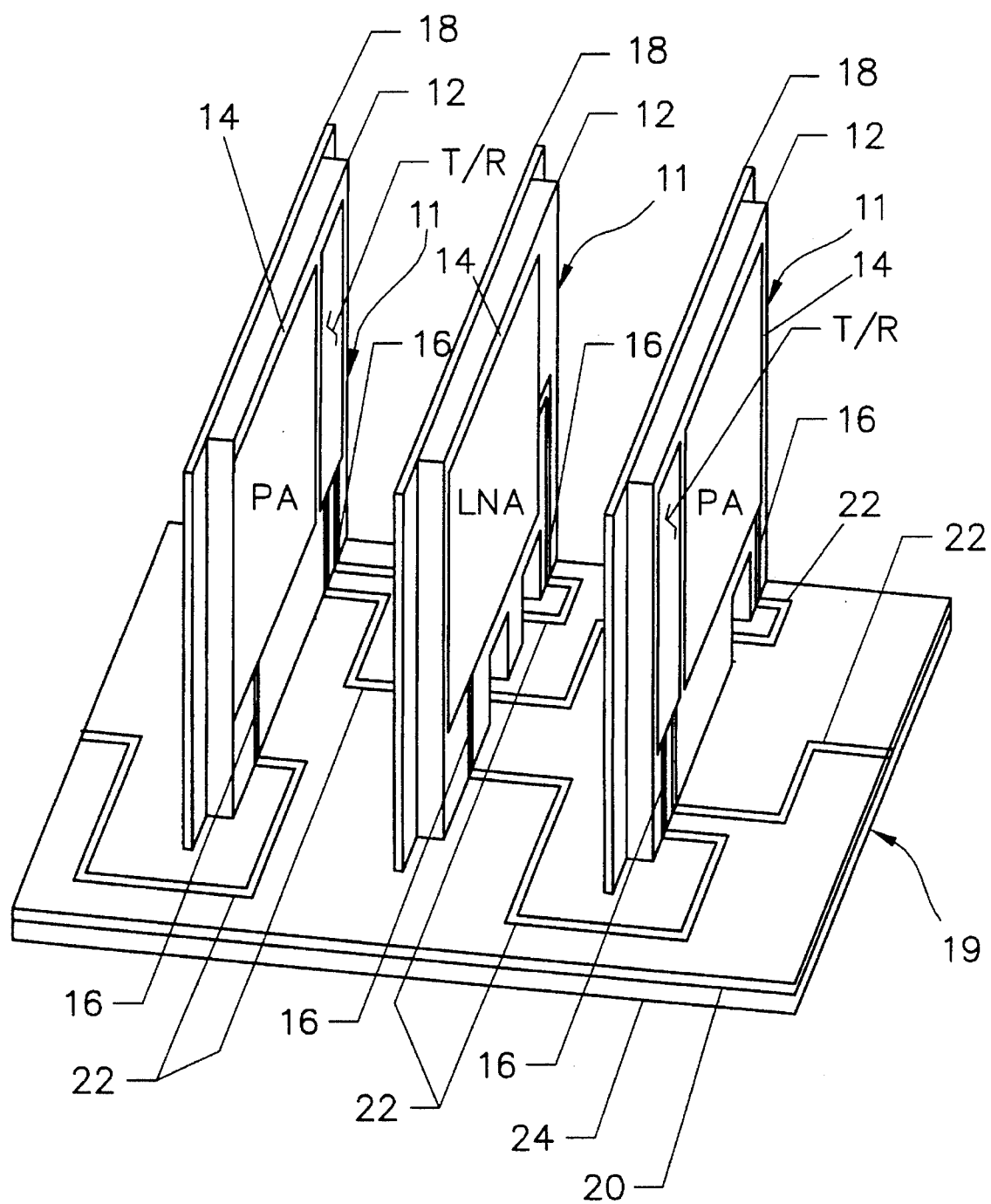
FIG. 1 is a view of the MMIC assembly.

Disclosed in FIG. 1 is one embodiment of the monolithic microwave integrated circuit (MMIC) assembly 10. Included in this embodiment of the assembly is at least one mating substrate assembly 11 mounted on base substrate assembly 19. Included in mating substrate assembly 11 is mating substrate 12 which is mounted on backing plate 18. Disposed on the surface of mating substrate 12 is a least one MMIC 14. Running from the MMIC 14 to the edge of mating substrate 12 are mating conductors 16. Each of the mating substrate assemblies 11 are mounted in base substrate assembly 19. Base conductors 24 run from the edge of the base substrate 20 to the point where the mating substrate assemblies are inserted in the base substrate. Included in base substrate assembly 19 is base substrate 20 mounted on plate 22.

The MMIC assembly 10 can be designed to accept any number of MMIC chips. In the assembly shown in FIG. 1, the base substrate has received three mating substrates mounted on backplates and two of the three mating substrates each has two MMIC's. Transmission lines are provided on both the mating substrates and the base substrate to establish electrical connection between the MMIC 14 on mating substrate 12 as well as to electronic components outside the assembly.

Figure 2A:
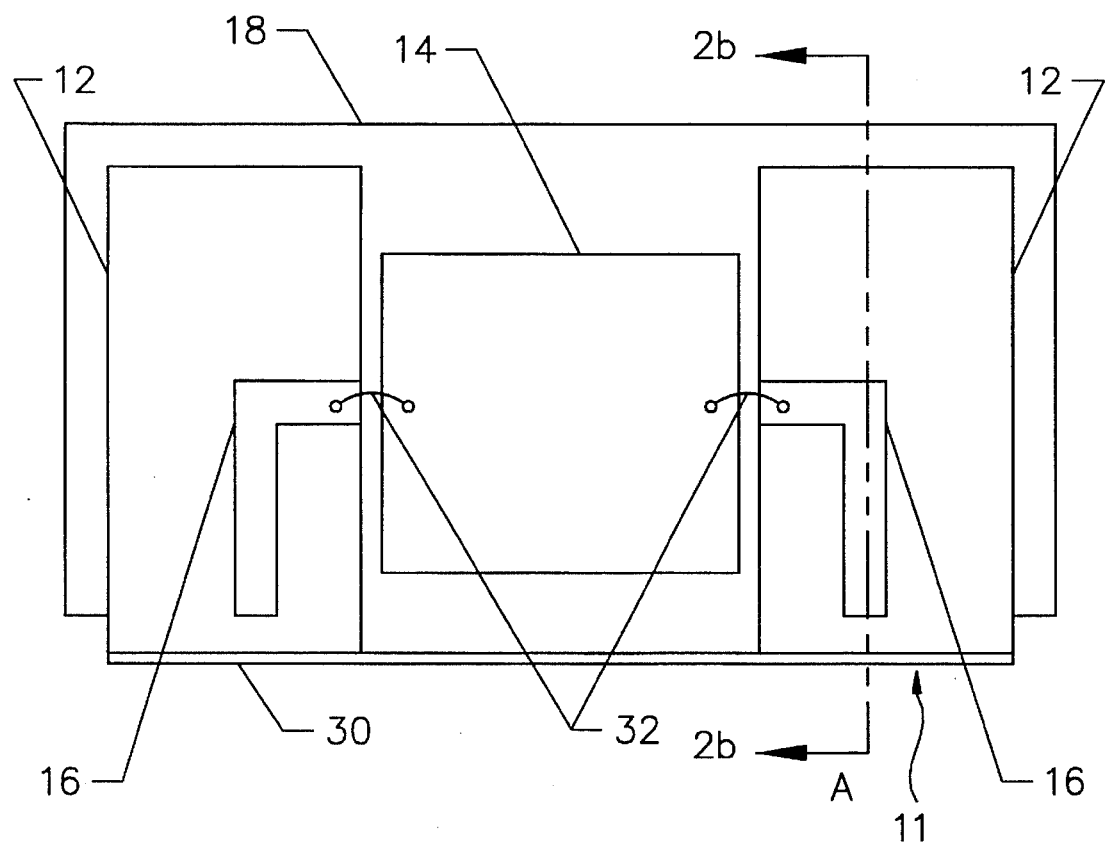
FIG. 2a is a front view of a mating substrate assembly and FIG. 2b is a cross sectional view of a mating substrate assembly.
Figure 2B:
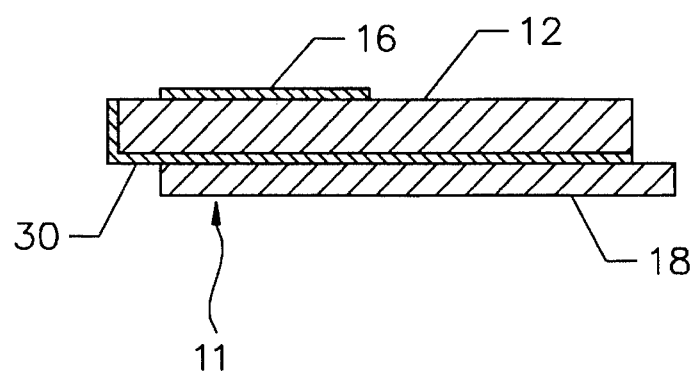

FIGS. 2a and 2b show a detailed view of an embodiment of a mating substrate assembly 11. For this embodiment, the mating substrate 12 is actually two pieces of 10 mil alumina (AL203). The substrates are mounted on a metal (such as Kovar) backing plate 18 which acts as a heat sink during operation of the assembly. Positioned between the alumina substrates on the backing plate 18 is MMIC 14. In this embodiment, MMIC 14 is constructed of gallium arsenide, and any number of electronic devices can be provided on the chip, for example an amplifier. Disposed on mating substrates 12 are mating conductor lines 16. The mating conductor lines are made of gold and are sputtered or evaporated over a thin layer of chromium to provide adhesion to the alumina. The MMIC 14's are electrically connected to the mating conductor lines through wire bonds or ribbons 32.

Figure 3A:
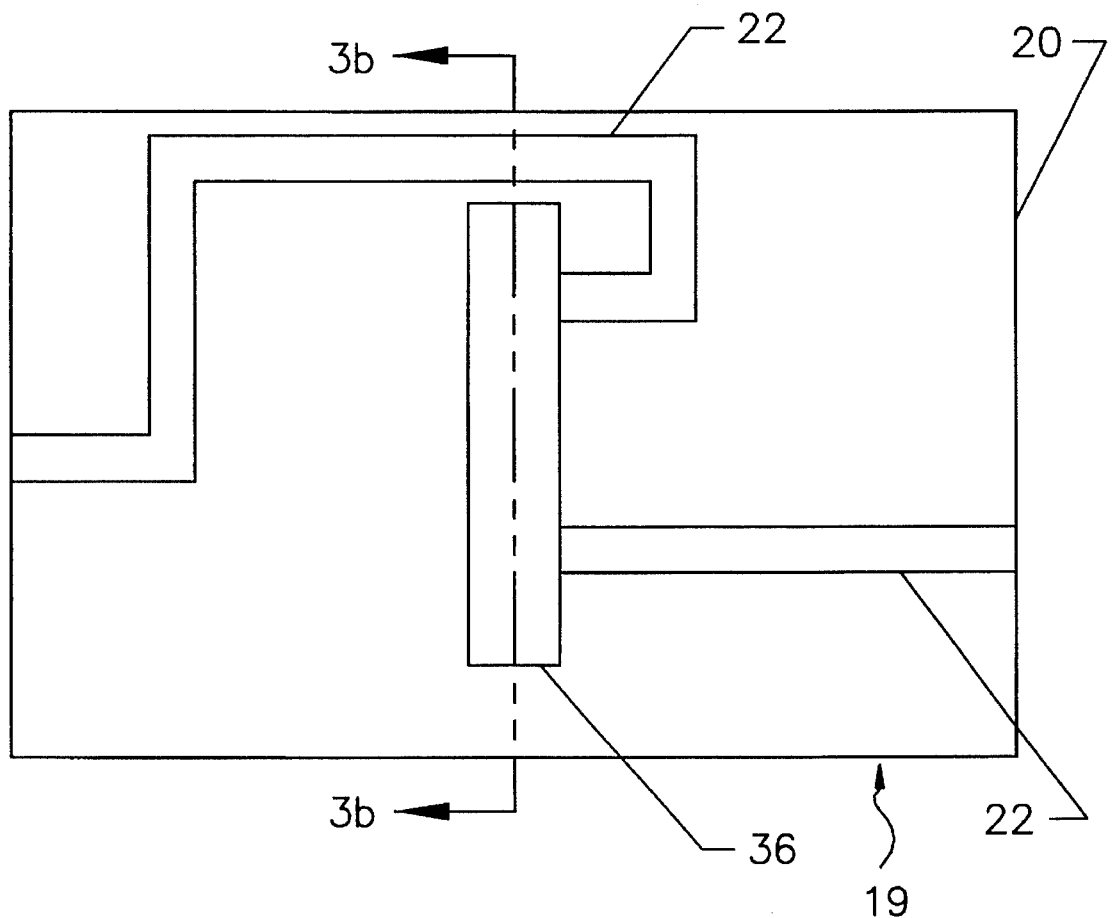
FIG. 3a is a top view of the base substrate assembly and FIG. 3b is a cross sectional view of the base substrate assembly.
Figure 3B:
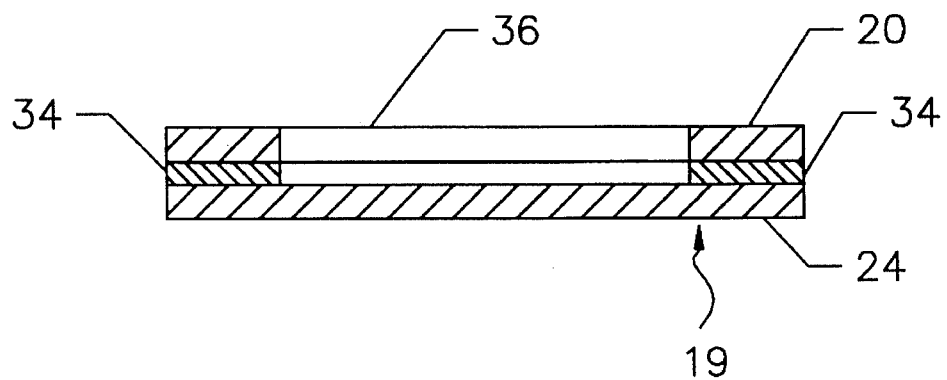

As seen in FIG. 2b, a ground plane 30 is disposed on the mating substrate 12 between the substrate 12 and the backing plate 18. This ground plane is applied to the substrate in the same manner as the mating conductor lines 16. The ground plane covers the entire surface between the mating substrate 12 and the backing plate 18 as well as the lower edge of the mating substrate. The lower edge of the mating substrate 12 is sized so that it fits within the base substrate assembly 19, which is shown in FIGS. 3a and 3b.

The base substrate 20 is also made of 10 mil thick alumina. Between the base substrate 20 and the mounting plate 24 is base ground plane 34. This ground plane is made of gold and is sputtered onto a thin layer of chromium in order to adhere to the alumina. The metal (e.g. brass or Kovar) mounting plate 24 is then attached to the base ground plane. On the surface of the base substrate 20 opposite the base ground plane 34, base conductor lines 22 are disposed. As with the transmission lines on the mating substrate, the base conductor lines 22 are made of gold sputtered onto a a thin layer of chromium. The base conductor lines 22 run from the edge of the base substrate to a slot 36 which passes through the base substrate 20 and the base ground plane. This slot is sized to receive the lower edge of the mating substrate 12.

Figure 4:
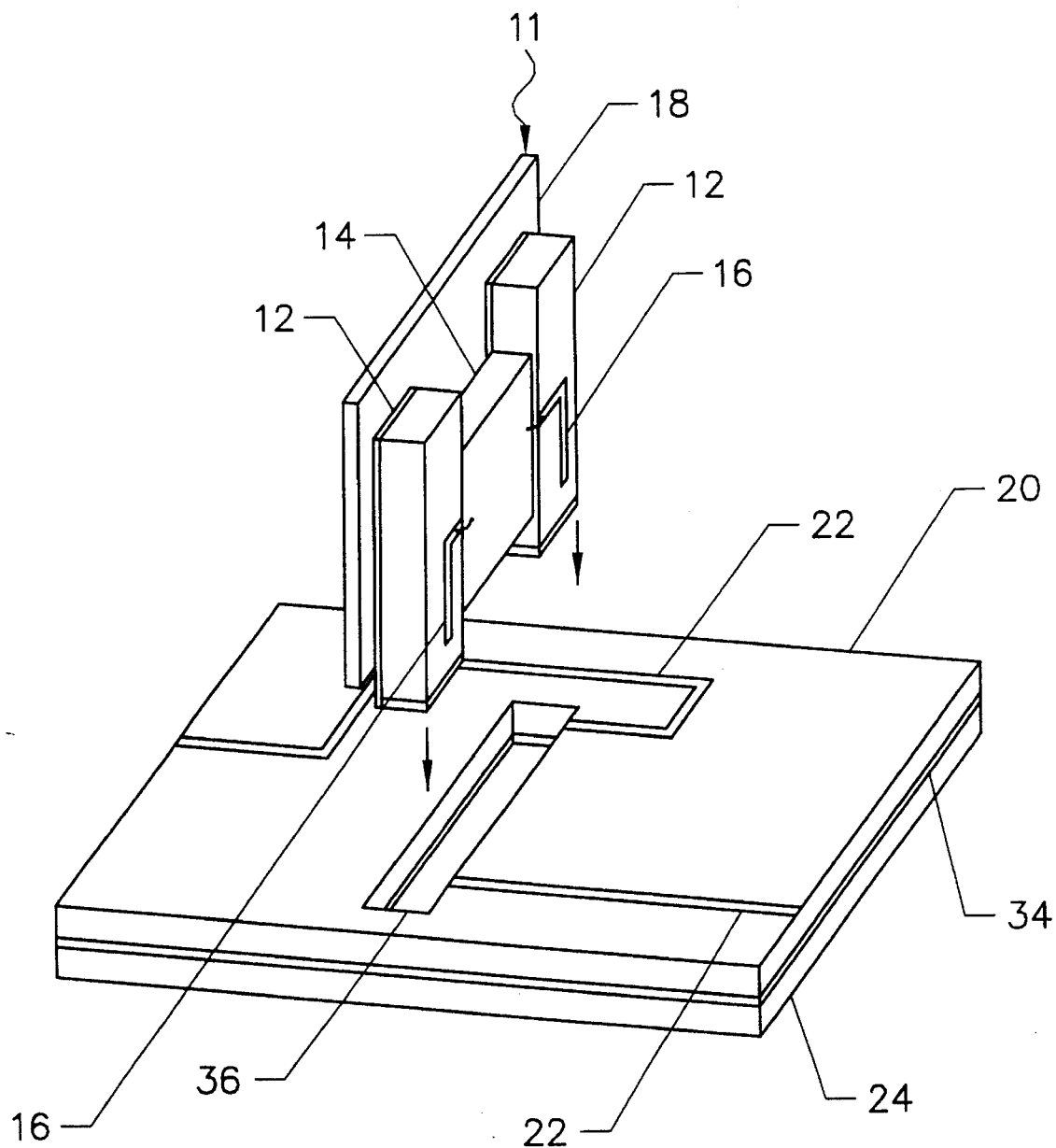
FIG. 4 is an exploded view of the MMIC assembly.
Figure 5:
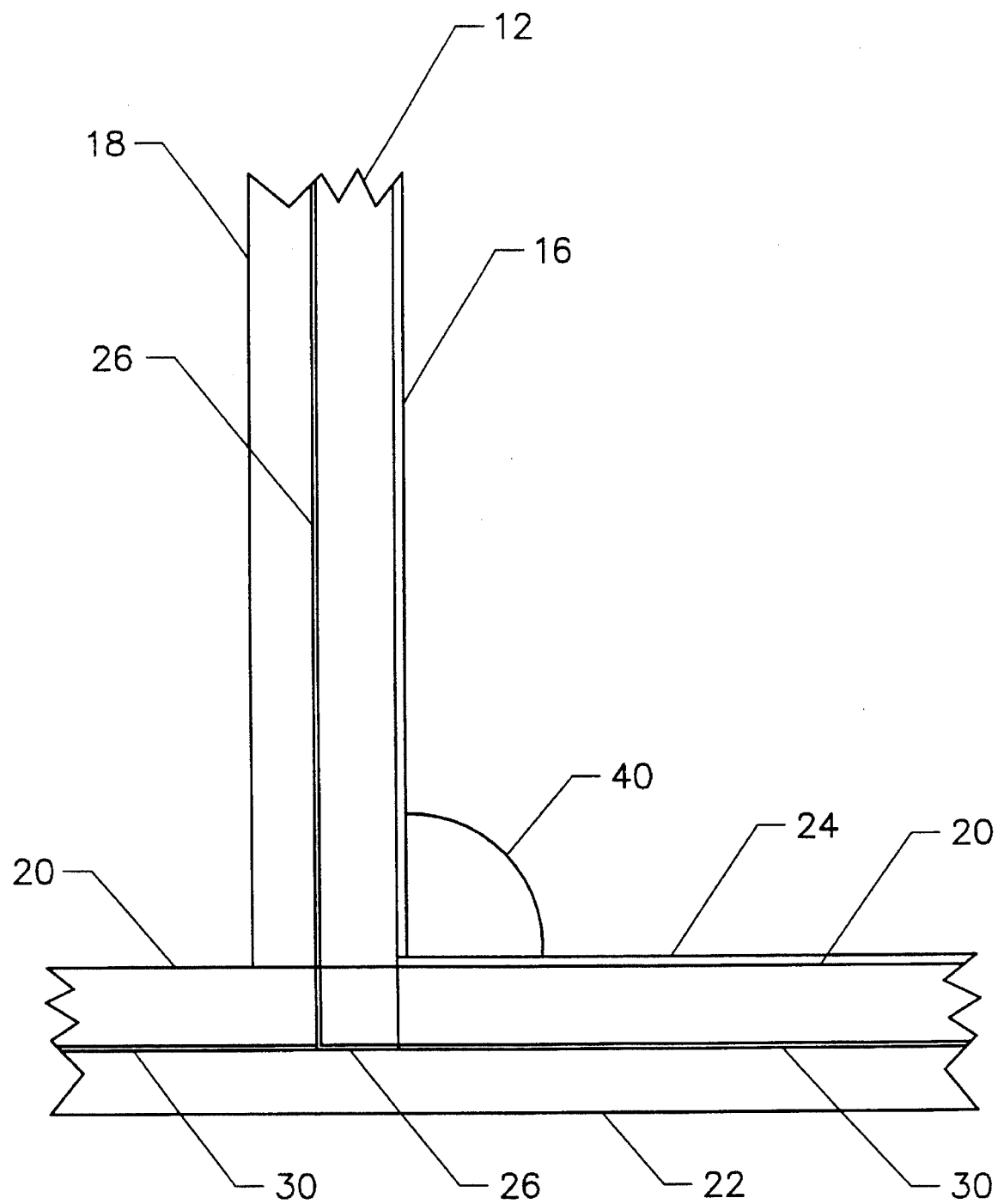
FIG. 5 is a side view of the electrical connection between the transmission lines on the mating substrate and the transmission lines on the base substrate.

As seen in the exploded view in FIG. 4, The mating substrate assembly 11 is inserted in slot 36 in the base substrate 43. The base conductor lines 22 on the base substrate 20 and the mating conductor lines 16 on the mating substrate 12 must be correctly positioned so they make electrical contact when the mating substrate 12 is inserted in the slot. The conductor lines on both substrates must have approximately the same width and thickness and should have no more than approximately a 1 mil alignment mismatch after insertion.

Once the mating substrate 12 has been inserted in the base substrate 20, the conductor lines are then checked for proper alignment and electrical contact. Once this is established, the two sets of conductor lines are soldered together or otherwise connected. In the preferred embodiment, the ends of all DC and RF conductor lines are tinned with 170 degree solder. When all the ends of all vertical and horizontal conductor lines come in contact, the joint is heated to 170 degrees for re-flow soldering of the conductor line contacts.

In operation, RF signals from an external source are coupled to the transmission line 22 on the base substrate 20. These signals are carried by the base substrate transmission lines 22 to the mating substrate assembly 11. For this embodiment, the conductor lines sized and located relative to the ground planes to provide a characteristic 50 ohm impedance. At the point where the transmission lines 16 on the mating substrate and the base transmission lines 22 on the base substrate 20 touch and are soldered, the signal is transferred with minimal reflection to the transmission line 16 on mating substrate 12. Although the point where the ground planes touch and the point where the conductor lines touch is a greater distance than is typical between the ground plane and the conductor lines for a 50 ohm impedance, tests have shown that this has little effect on the signal integrity when compared with other conventional interconnect techniques. In fact, only a 0.1 to 0.2 db variation was noted at a measurement taken at 35 GHz. Further, geometrical refinements in the widths of the conductor lines 22 and 16 near the connection can be made to reduce even further the small electric disturbance associated with the connection.

Once the signal is transmitted through the electronic devices on the MMIC's, the signal returns to the same type of joint between the mating substrate and the base substrate. the signal can either be transmitted to another vertically standing MMIC or to other electronics outside this particular assembly.

Figure 6:
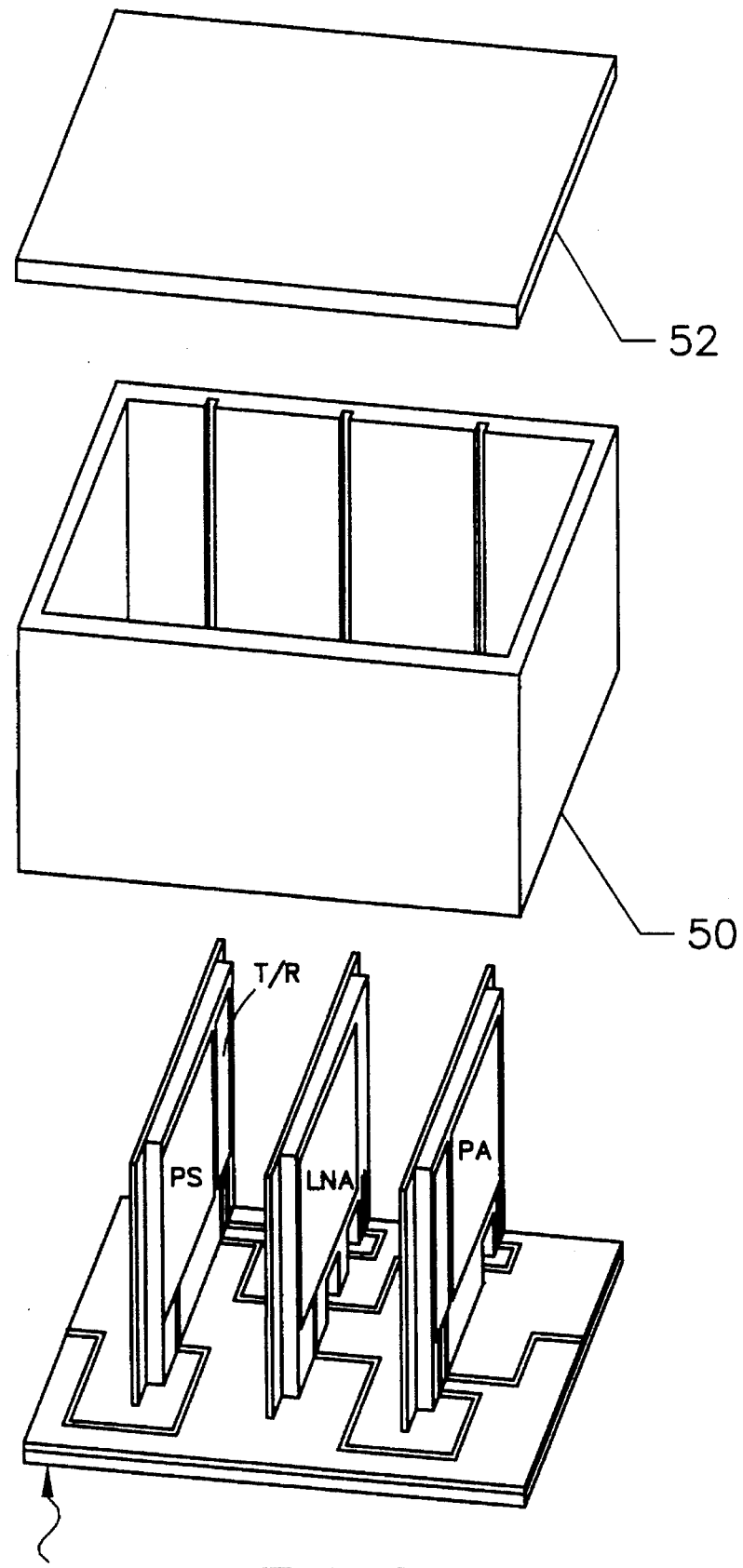
FIG. 6 is an exploded view of the MMIC assembly housing.

In order to incorporate the MMIC's into such uses as a phased array antenna, the components must be properly packaged. FIG. 6 shows a 3D packaged module using the 90 degree RF interconnects. This particular package is designed for use in active electronically steerable phased-array antenna for radar and communications applications at millimeter-wave frequencies. The module is comprised of the MMIC assembly 10, the side walls 50, and the top cover 52. The side walls and the top cover are made from materials having good thermal conductivity for heat conduction generated by the MMIC's soldered on the vertical cards. The walls have grooves on one side only which guide the vertical cards containing the MMIC's and transmission lines. Because of the space conservation due to the use of the 90 degree interconnect, the design of the module meets the half wavelength spacing requirements for many phased-array antenna applications.

Figure 7:
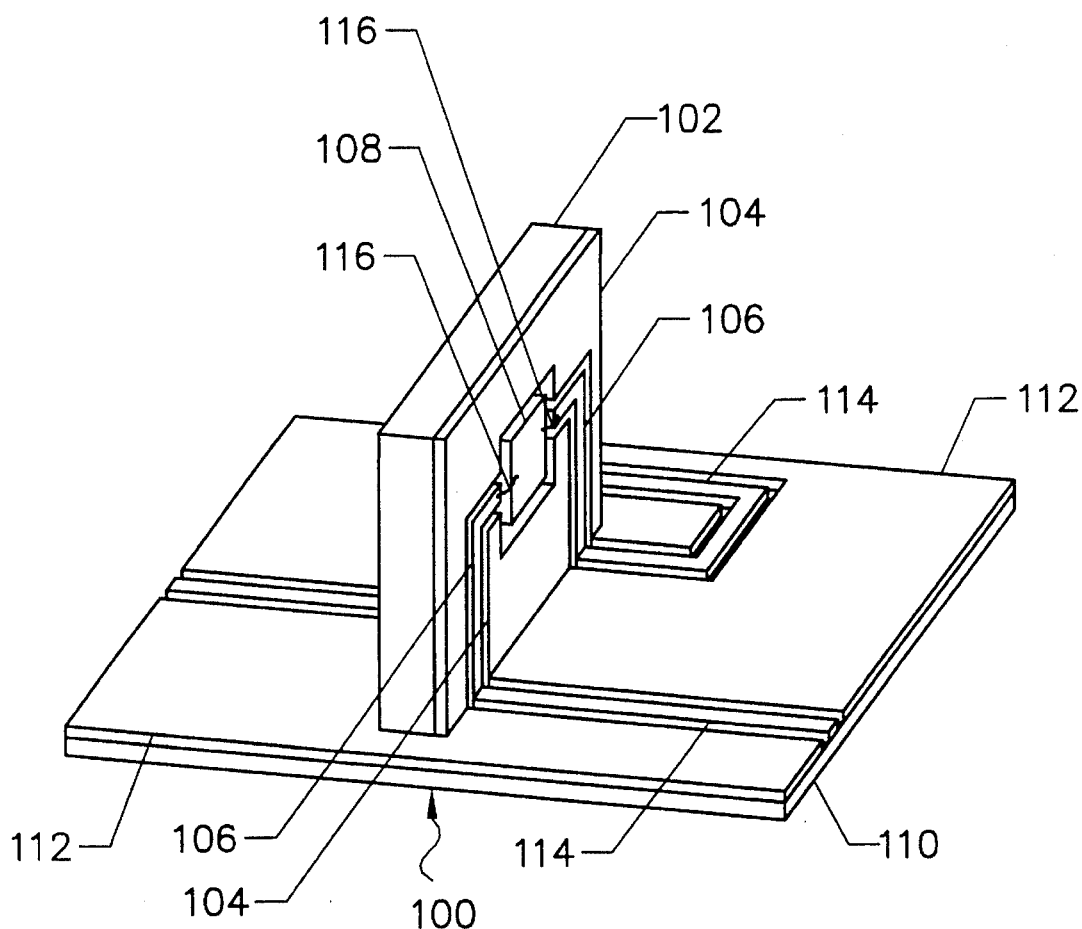
FIG. 7 is a view of the MMIC assembly implemented with coplanar waveguides.

Shown in FIG. 7 is an alternate embodiment of the MMIC assembly. This assembly 100 differs from the MMIC assembly 10 in that it employs a coplanar signal waveguide. On the mating substrate 102 a mating ground plane 104 is disposed. Also disposed on the surface of the mating substrate 102 are mating conductor lines 106 which run through gaps in the ground plane 104. The mating conductor lines 106 run from the edge of the substrate 102 to the MMIC 108 which is mounted on the substrate. The mating conductor lines 106 are electrically connected to the MMIC 108 through metallic bond wires 116 or ribbon.

The mating substrate 102 is mounted in base substrate 110. Base substrate 110 has a base ground plane 112 which covers nearly one surface of the substrate. Running between gaps in the base ground plane 112 are base conductor lines 114. These base conductor lines run from the edge of the substrate 110 to the mating conductor lines 106 when the mating substrate 102 is inserted in the base substrate 110.

As with the MMIC assembly 10 described above, the mating substrate 102 is made of alumina while the mating ground plane 104 and mating transmission lines 106 disposed on the substrate are made of gold. In order to insure signal integrity in this transmission scheme, the alumina substrate 102 may be thicker in order to offset the effects of any metal located near the assembly. The base substrate 100 is also made of alumina while the base ground plane 112 and the base conductor lines 114 are made of gold.

Figure 8:
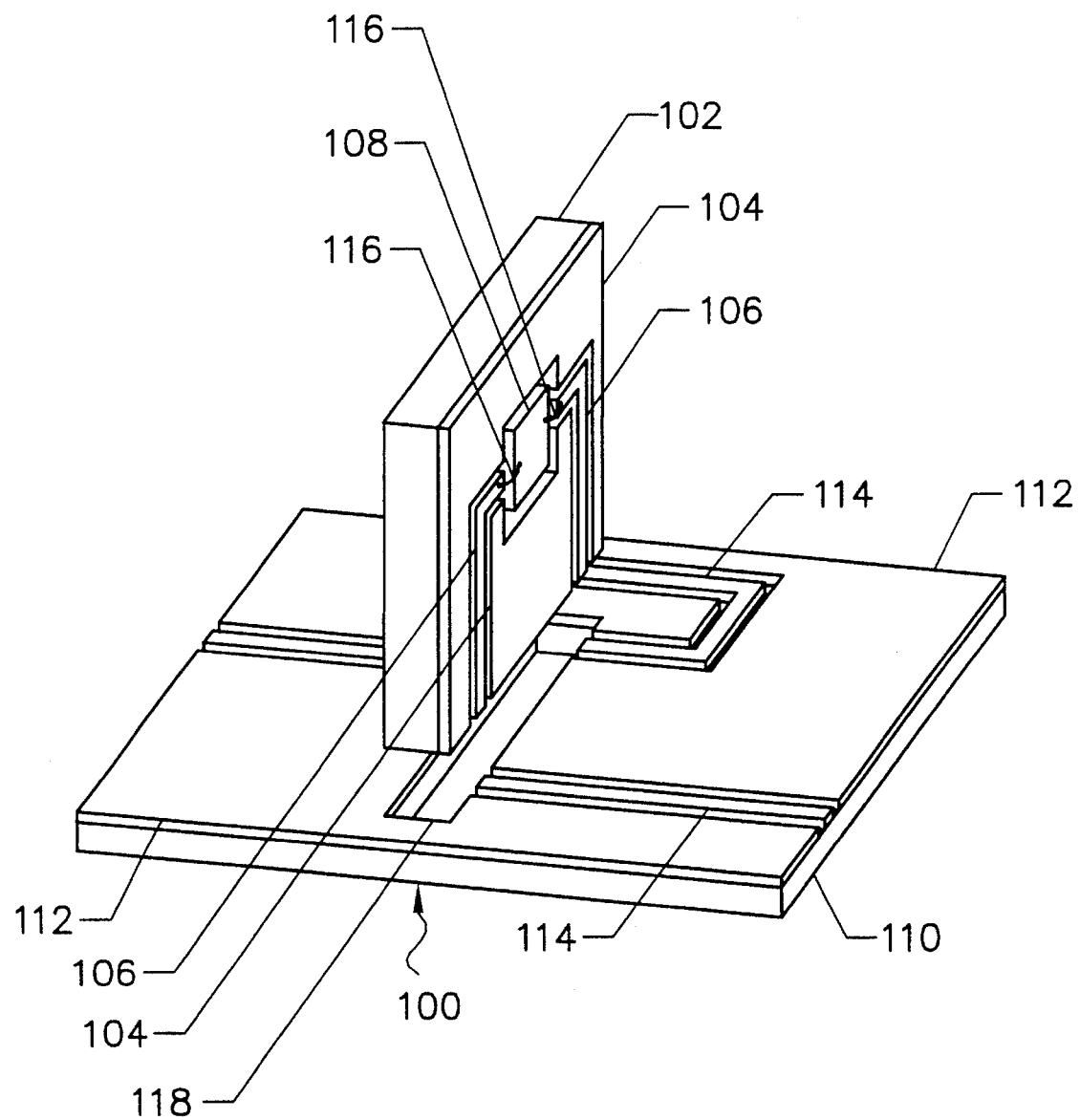
FIG. 8 is an exploded view of the MMIC assembly with coplanar waveguides.

As seen in the exploded view in FIG. 8, when the MMIC assembly is complete, the mating substrate 102 is inserted in slot 118 which passes through base substrate 110 and base ground plane 112. When the mating substrate 102 is inserted, an electrical connection is made between mating ground plane 104 and base ground plane 112. An electrical connection is also made between mating conductor lines 106 and base conductor lines 114. In order to ensure a constant electrical connection, the joint where the different conductor lines come into contact is soldered with 170° solder. This connection can be made with other types of connection means such as metalized ribbons with the purpose being to provide a cleaner electrical connection which minimizes any signal loss or reflection.

In operation, RF signals from external sources are coupled to base transmission lines 114 on base substrate 110. These signals are carried by base transmission lines 114 to the mating substrate 102. For this embodiment, the transmission lines on both substrates are sized and their location relative to the ground plane is such that a characteristic 50 ohm impedance is provided. At the point where the conductor lines touch and are soldered, the signal is transferred with minimal reflection to the mating conductor line 106 on the mating substrate 102. The signal is then transmitted through the conductor lines through the MMIC 108 and then returned to the base substrate 100 at the point where the mating conductor lines touch on the other side of the MMIC 108. The signal can either be transmitted to another vertically standing MMIC or to other electronics outside this particular assembly.

The foregoing is a description of a novel and nonobvious three-dimensional package for monolithic microwave/millimeterwave integrated circuits. The applicant's do not intend to limit the invention to the foregoing description, but instead define the invention through the claims appended hereto.

We claim:

1. A three dimensional package for monolithic microwave/millimeter wave integrated circuits (MMIC's) comprising:

at least one mating substrate with first signal transmission means disposed thereon, for receiving at least one MMIC; and a base substrate which receives and holds each of said mating substrates at substantially right angles with respect to said base substrate, said base substrate has second signal transmission means disposed thereon which electrically contacts the first signal means and allows the transmission of microwave/millimeter wave signals between each of said mating substrates and said base substrate; and wherein:

the first signal transmission means is comprised of first conductor line means in close proximity to a mating ground plane means and the second signal transmission means is comprised of a second conductor line means in close proximity to a base ground plane means; and each of said mating substrates has first and second opposing sides and upper and lower edges, the mating ground plane means is disposed on the first side and lower edge of said mating substrate, and the first conductor line means is disposed on the second side of said mating substrate.

2. The three dimensional package for MMIC's of claim 1 wherein the base substrate has first and second opposing sides and a base ground plane means is disposed on the first side of said base substrate and the second conductor lines means are disposed on the second side of said base substrate.

3. The three dimensional package for MMIC's of claim 2 wherein the first and second conductor line means are characterized with respect to the mating substrate ground plane means and the base substrate ground plane means to provide a uniform and characteristic impedance.

4. The three dimensional package for MMIC's of claim 3 wherein each of the mating substrates is soldered to the base substrate at a point where each of the first conductor line means comes in electrical contact with each of the second conductor line means 5. A three dimensional package for monolithic microwave/millimeter wave integrated circuits (MMIC's) comprising:

at least one mating substrate with first signal transmission means disposed thereon, for receiving at least one MMIC, and a base substrate which receives and holds each of said mating substrates at substantially right angles with respect to said base substrate, said base substrate has second signal transmission means disposed thereon which electrically contacts the first signal means and allows the transmission of microwave/millimeter wave signals between each of said mating substrates and said base substrate; and wherein:

the first signal transmission means is comprised of first conductor line means in close proximity to a mating ground plane means and the second signal transmission means is comprised of a second conductor line means in close proximity to a base ground plane means; and each of said mating substrates has first and second opposing sides, the first signal transmission means is disposed on the first side of the mating substrate in a coplanar waveguide configuration.

6. The three dimensional package for MMIC's of claim 5 wherein the base substrate has first and second opposing sides and the second signal transmission means are disposed on the first side of the mating substrate in a coplanar waveguide configuration.

7. The three dimensional package for MMIC's of claim 6 wherein the first and second conductor line means are characterized with respect to the mating ground plane and the base ground plane to provide a uniform characteristic impedance.

8. The three dimensional package for MMIC's of claim 7 wherein each of the mating substrates is soldered to the base substrate at a point where each of the first conductor line means and the mating ground plane means come in electrical contact with the second conductor line means and the base ground plane means.

9. A three dimensional package for monolithic microwave/millimeter wave integrated circuits (MMIC's) comprising:

a base substrate with at least one slot which passes through said base substrate;

a plurality of first conductor lines disposed on said base substrate;

a first ground plane disposed on said base substrate, proximate to said first conductor lines so as to provide a constant impedance through said first conductor lines;

at least one mating substrate for receiving at least one electronic device with upper and lower edges where the lower edge is sized to pass into the slot in the base substrate and each of said mating substrates is held in one of the slots in a position substantially perpendicular to said base substrate;

a second ground plane disposed on said mating substrate, proximate to said first conductor lines so as to provide a constant impedance through said second conductor lines; and a plurality of second conductor lines disposed on said mating substrate in electrical contact with the electronic device which also make electrical contact with the first conductor lines of said base substrate when said mating substrate is mounted in the slot so as to allow transmission of microwave/millimeterwave signals between said base substrate and each of said mating substrates.

10. The three dimensional package for MMIC's of claim 9 wherein each of said mating substrates has first and second opposing sides and the first ground plane is disposed on the first side and lower edge of said mating substrate, and the first conductor lines are disposed on the second side of said base substrate.

11. The three dimensional package for MMIC's of claim 10 wherein the base substrate has first and second opposing sides and the second ground plane is disposed on the first side of said base substrate and the second conductor lines are disposed on the second side of said base substrate.

12. The three dimensional package for MMIC's of claim 11 wherein the first and second conductor lines are characterized with respect to the first and second ground planes to provide a uniform characteristic impedance.

13. The three dimensional package for MMIC's of claim 12 wherein each of the mating substrates is soldered to the base substrate at a point where each of said first conductor lines come in electrical contact with each of said second conductor lines.

14. The three dimensional package for MMIC's of claim 9 wherein each of said mating substrates has first and second opposing sides, and a first ground plane and a plurality of first conductor lines are disposed on the first side of the mating substrate in a coplanar waveguide configuration.

15. The three dimensional package for MMIC's of claim 14 wherein the base substrate has first and second opposing sides, and the second ground plane and a plurality of second conductor lines are disposed on the first side of the mating substrate in a coplanar waveguide configuration.

16. The three dimensional package for MMIC's of claim 15 wherein the first and second conductor lines are characterized with respect to the mating substrate ground plane and the base substrate ground plane to provide a uniform characteristic impedance.

17. The three dimensional package for MMIC's of claim 16 wherein each of the mating substrates is soldered to the base substrate at a point where each of the first conductor lines and the first ground plane comes in electrical contact with the second conductor lines and the second ground plane.

* * * * *